(12) United States Patent
Zhang

(10) Patent No.: US 7,138,834 B2
(45) Date of Patent: *Nov. 21, 2006

(54) SYMMETRIC DIFFERENTIAL LOGIC CIRCUITS

(75) Inventor: Bo Zhang, Las Flores, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/884,432

(22) Filed: Jul. 2, 2004

(65) Prior Publication Data

US 2004/0239370 A1 Dec. 2, 2004

Related U.S. Application Data

(63) Continuation of application No. 10/243,281, filed on Sep. 12, 2002, now Pat. No. 6,781,420.

(51) Int. Cl.
 *H03K 19/20* (2006.01)
(52) U.S. Cl. ...................................... 326/115; 326/119

(58) Field of Classification Search ................ 326/112, 326/119, 121, 115
See application file for complete search history.

(56) References Cited

U.S. PATENT DOCUMENTS

| 5,945,847 A | 8/1999 | Ransijn |
| 6,175,248 B1 | 1/2001 | Mack |
| 6,414,519 B1 | 7/2002 | Abernathy |

*Primary Examiner*—Don Le

(57) ABSTRACT

Embodiments of the present invention perform logical operations utilizing a symmetric logic circuit comprising two logic units. In a symmetric logic circuit, the circuit configuration used to process a first logic input in the first logic unit is the same as the circuit configuration used to process a second logic input in the second logic unit, and the circuit configuration used to process the second logic input in the first logic unit is the same as the circuit configuration used to process the first logic input in the second logic unit. The present invention may be used for logic circuits that perform a variety of logical operations, such as XOR, AND, NAND, OR, or NOR.

20 Claims, 4 Drawing Sheets

US 7,138,834 B2

SYMMETRIC DIFFERENTIAL LOGIC CIRCUITS

CROSS-REFERENCE TO RELATED APPLICATION(S)

The present application is a continuation of U.S. patent application Ser. No. 10/243,281 filed Sep. 12, 2002, now U.S. Pat. No. 6,781,420, the disclosure of which is hereby incorporated by reference herein.

BACKGROUND

The present invention relates in general to electronic circuits and in particular to logic circuits.

The growth and maturity of the electronics industry has led to a variety of products that have changed the way people live and work. Electronic circuits are currently the dominant technology for creating products that move and shape information. In the world of electronics, information is typically represented by zeros and ones. Electronic representations of zeros and ones are referred to as digital signals. Electronic circuits process digital signals using logic circuits to perform a wide variety of functions.

However, as the electronics industry continues to grow, there is an ever increasing demand on the amount of information that must be processed by electronic circuits. Accordingly, the speed at which these electronic circuits operate has continually increased. An electronic circuit's processing speed is determined by the frequency of the signals. For example, some electronic circuits carry out a processing operation on each rising edge of a system clock. These circuits are referred to as "synchronous" circuits. Therefore, the processing speed of the circuit will be determined by the frequency of the clock.

As the operating frequency of electronic circuits continues to increase, the timing relationships between signals can severely limit the performance of the system. For example, if a clock signal triggers the execution of a function requiring two digital input signals, the function will produce an erroneous result if the clock signal triggers the function before one or both of the digital inputs are available for processing. The time period during which a signal is typically stable is determined by the transitions of the signals. For example, if a circuit output signal transitions from a low voltage to a high voltage in response to a first set of inputs, and then from the high voltage to a low voltage in response to a subsequent set of inputs, then the output of the circuit will be stable for a period of time determined by the transitions from low to high and high to low voltages. However, typical logic circuits will have different transition characteristics in response to different sets of inputs, which can deleteriously affect timing requirements. Accordingly, there is a need for logic circuits with improved transition characteristics.

SUMMARY

Embodiments of the present invention perform logical operations utilizing a symmetric logic circuit comprising two logic units. In a symmetric logic circuit, the circuit configuration used to process a first logic input in the first logic unit is the same as the circuit configuration used to process a second logic input in the second logic unit, and the circuit configuration used to process the second logic input in the first logic unit is the same as the circuit configuration used to process the first logic input in the second logic unit. The present invention may be used for logic circuits that perform a variety of logical operations, such as XOR, AND, NAN OR, or NOR.

In one embodiment, a logic circuit comprises a first differential logic unit receiving first and second differential logic signals on first and second pairs of differential input terminals, respectively, the first differential logic unit performing a first logical operation on the first and second logic signals, and in accordance therewith, producing first differential output signals on a first pair of differential output terminals. The logic circuit also includes a second differential logic unit, receiving the second differential logic signals on a third pair of differential input terminals coupled to the second pair of terminals on the first logic unit, and receiving the first differential logic signals on a fourth pair of differential input terminals coupled to the first pair of terminals on the first logic unit, the second differential logic unit also performing the first logical operation on the first and second logic signals, and in accordance therewith, producing second differential output signals on a second pair of differential output terminals coupled to the first pair of differential output terminals. The present invention may be used for logic circuits that perform a variety of logical operations, such as XOR, AND, NAND, OR, or NOR.

The following detailed description and accompanying drawings provide a better understanding of the nature and advantages of the present invention.

DETAILED DESCRIPTION

Figure 1:
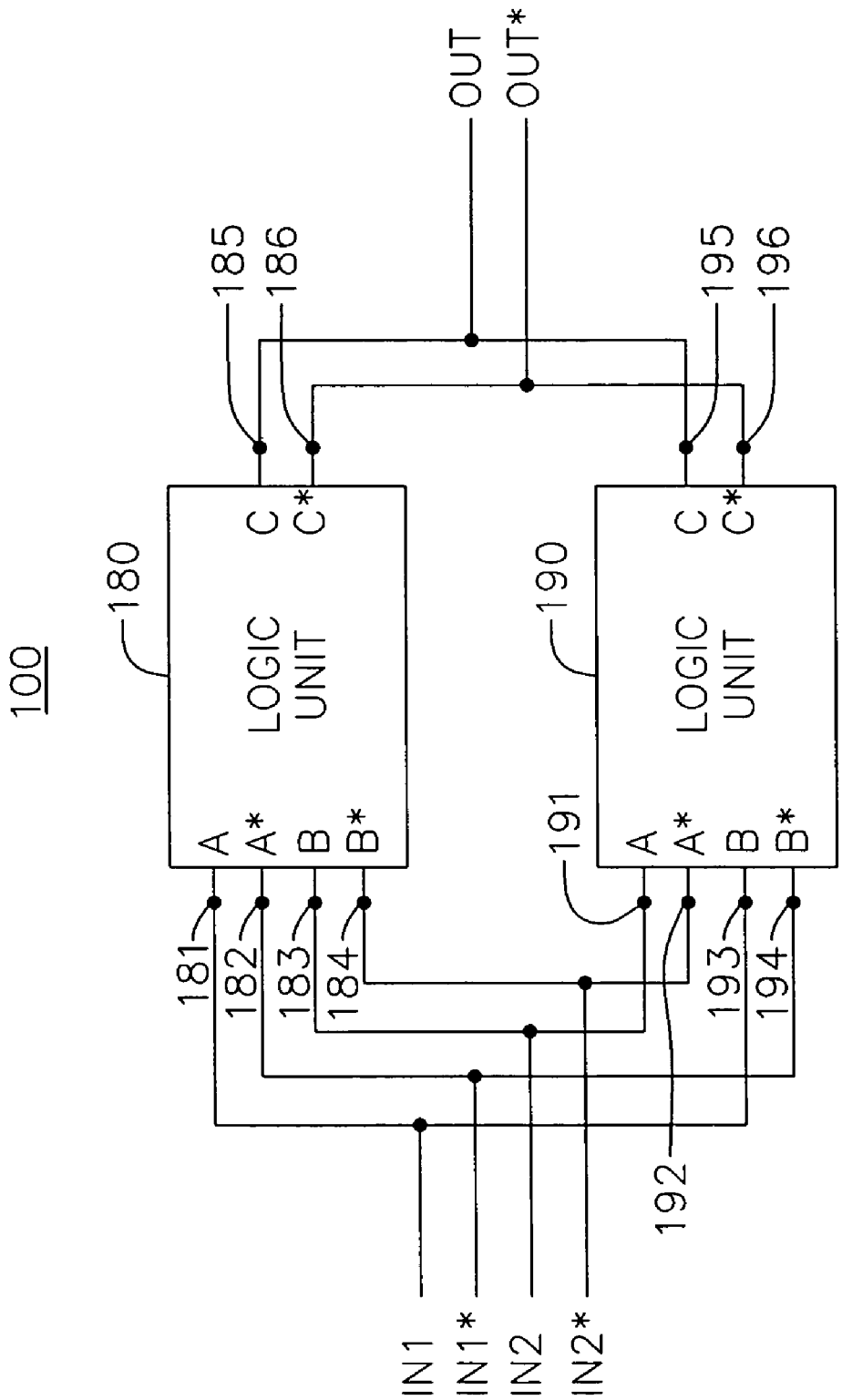
FIG. 1 illustrates a logic circuit according to one embodiment of the present invention.

FIG. 1 illustrates a logic circuit 100 according to one embodiment of the present invention. Logic circuit 100 includes two differential logic units 180 and 190. Each logic unit 180 and 190 performs the same logical operation on the inputs. Logic operations may include AND, NAND, OR, NOR, or exclusive-OR ("XOR"), for example. Logic circuits typically receive and process different input signals using different devices (e.g., transistors). The particular configuration of devices defines the logical operation of the logic unit. One problem is that different inputs will have different circuit paths to the output. Accordingly, different input transitions that produce the same logical output transition (e.g., transitions from low to high voltage or high to low voltage) may result in different output transition characteristics (e.g., different rise and fall times). In high frequencies applications, different output transition characteristics can severely limit system performance.

To solve this problem, the structure for carrying out the logical operations according to the present invention utilizes a symmetric logic circuit comprising two logic units. In a symmetric logic circuit, the circuit configuration used to process a first logic input in the first logic unit is the same as the circuit configuration used to process a second logic input in the second logic unit, and the circuit configuration used to process the second logic input in the first logic unit is the same as the circuit configuration used to process the first logic input in the second logic unit. Logic unit 180 receives first differential logic input signals {IN1, IN1*} on a first pair of differential input terminals 181 and 182 ("A" and "A*"). Logic unit 180 also receives second differential logic input signals {IN2, IN2*} on a second pair of differential input terminals 183 and 184 ("B" and "B*"). Logic unit 190 receives the second differential logic inputs signals {IN2, IN2*} on a third pair of differential input terminals 191 and 192 ("A" and "A*"), which are coupled to input terminals 183 and 184. Similarly, logic unit 190 receives the first differential logic inputs signals {IN1, IN1*} on a fourth pair of differential input terminals 193 and 194 ("B" and "B*"), which are coupled to input terminals 181 and 182. Because each logic unit performs exactly the same logical operation, switching the inputs will produce the same logical result. Therefore, the differential output terminals 185 and 186 of logic unit 180 may be coupled to the differential output terminals 195 and 196 of logic unit 190. Switching the inputs results in each input being processed in parallel by each logic unit. As a result, the output transition characteristics of the differential output signals from logic units 180 and 190 on coupled terminals 185/195 and 186/196 are approximately the same. While the present example shows logic units with only two inputs, it is to be understood that logic units having different numbers of inputs could also be used.

Figure 2:
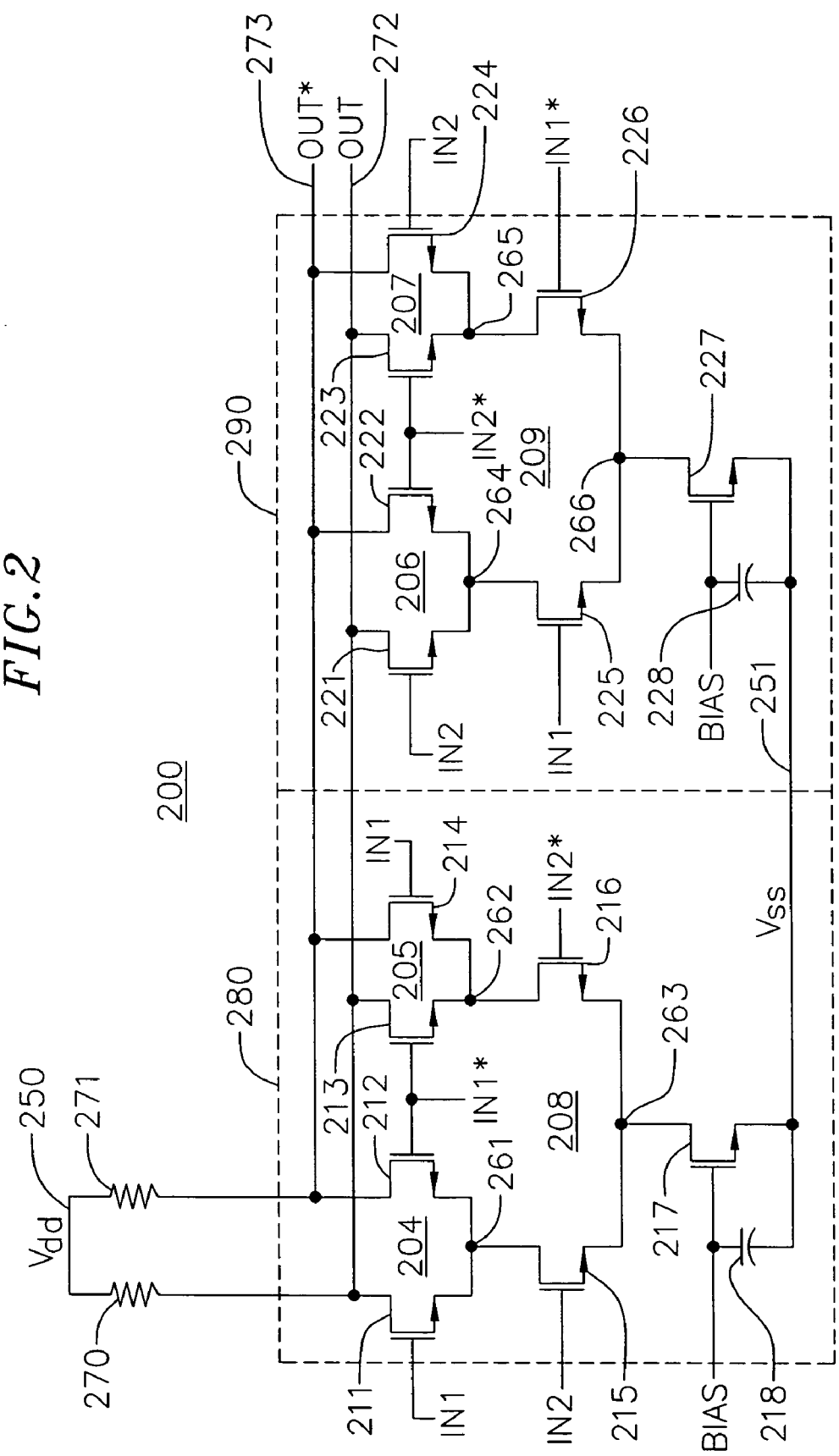
FIG. 2 illustrates an XOR logic circuit according to one embodiment of the present invention.

FIG. 2 illustrates an XOR logic circuit 200 according to one embodiment of the present invention that is particularly useful for high speed applications. XOR logic circuit 200 may be advantageously implemented using a combination of the technique illustrated in FIG. 1 with current-controlled complementary metal-oxide-semiconductor field-effect transistor (i.e., C³MOS™) logic, some of which is described in more detail in commonly owned U.S. application Ser. No. 09/484,856 entitled "CURRENT-CONTROLLED CMOS LOGIC FAMILY" filed Jan. 18, 2000 by Armond Hairapetian, which is hereby incorporated herein by reference in its entirety.

XOR logic circuit 200 includes two XOR logic units 280 and 290. Each logic unit includes three differential input pairs and a current source. The output of each logic unit is coupled to a differential load for driving one or the other output terminals 272 and 273 (OUT and OUT*) to a high voltage in accordance with the logical operation carried out on the inputs. Resistors 270 and 271 may be used as load devices, for example.

The input signals to XOR logic circuit 200 are differential inputs {IN1, IN1*} and {IN2, IN2*} and a bias input "BIAS" for generating current in the circuit. XOR circuit 200 receives differential input signals in each of the two XOR logic units 280 and 290. Each XOR logic unit 280 and 290 includes three differential input pairs, 204, 205 and 208, and 206, 207 and 209, respectively. Differential input pairs 204 and 205 include NMOS transistors 211,212,213, and 214. Transistors 211 and 212 have their source outputs coupled together (i.e., form a source coupled pair) at node 261, and transistors 213 and 214 have their sources coupled together at node 262 to form a source coupled pair. Likewise, differential input pairs 206 and 207 include NMOS transistors 221, 222, 223, and 224. Transistors 221 and 222 have their source outputs coupled together at node 264 to form a source coupled pair, and transistors 223 and 224 have their source outputs coupled together at node 265 to form a source coupled pair. The current in the differential input pairs 204–207 is controlled by NMOS transistors 215–216 and 225–226, which also have their sources coupled together at nodes 263 and 264, respectively, to form source coupled pairs. Current in each XOR logic unit may be generated by a bias current transistor (e.g., NMOS transistors 217 and 227), which receives a bias voltage "BIAS" on a gate input terminal. The gate input terminals of transistors 217 and 227 may also be coupled to capacitors 218 and 228, respectively.

XOR circuit 280 receives differential input signals {IN1, IN1*} comprising a logic input signal and the inverse of the logic input signal at the input terminals of differential input transistors 211–214. Differential inputs {IN2, IN2*}, which also comprise a logic input signal and the inverse of the logic input signal, are coupled to the input terminals of transistors 215 and 216. Similarly, XOR circuit 290 receives differential input signals {IN2, IN2*} at the input terminals of differential input transistors 221–224. Input signals {IN1, IN1*} are coupled to the input terminals of transistors 225 and 226. For high speed applications, AC coupling capacitors (not shown) may be coupled in series to the input terminals of transistors 215–216 and 225–226.

The current generated by transistors 217 and 227 may be selectively coupled to each output terminal 272 and 273 in response to the differential input signals received at the input of XOR circuit 200. The drain output of transistor 217 is coupled to source coupled node 263 of differential pair 208, and the drain outputs of transistors 215 and 216 are coupled to source coupled nodes 261 and 262 of differential pairs 204 and 205, respectively. The drain outputs of transistors 211, 213, 221, and 223 are connected to resistor 270 and output terminal 272. Consequently, when the input signals are in a state that produces a current path between the drain of transistor 217 and output terminal 272, the output will drop in voltage. Similarly, the drain output of transistor 227 is coupled to source coupled node 266 of differential pair 209, and the drain outputs of transistors 225 and 226 are coupled to source coupled nodes 264 and 265 of differential pairs 206 and 207, respectively. The drains of transistors 212, 214, 222, and 224 are connected to resistor 271 and output terminal 273. Consequently, when the input signals are in a state that produces a current path between the drain of transistor 227 and output terminal 273, the output will drop in voltage. Resistors 270 and 271 are also connected to supply terminal 250 ("Vdd"), which pulls the output terminals OUT and OUT* to the supply voltage when the combined input signals do not establish a current path between the drains of transistors 217 or 227 and the output terminals 272 and 273.

Figure 3:
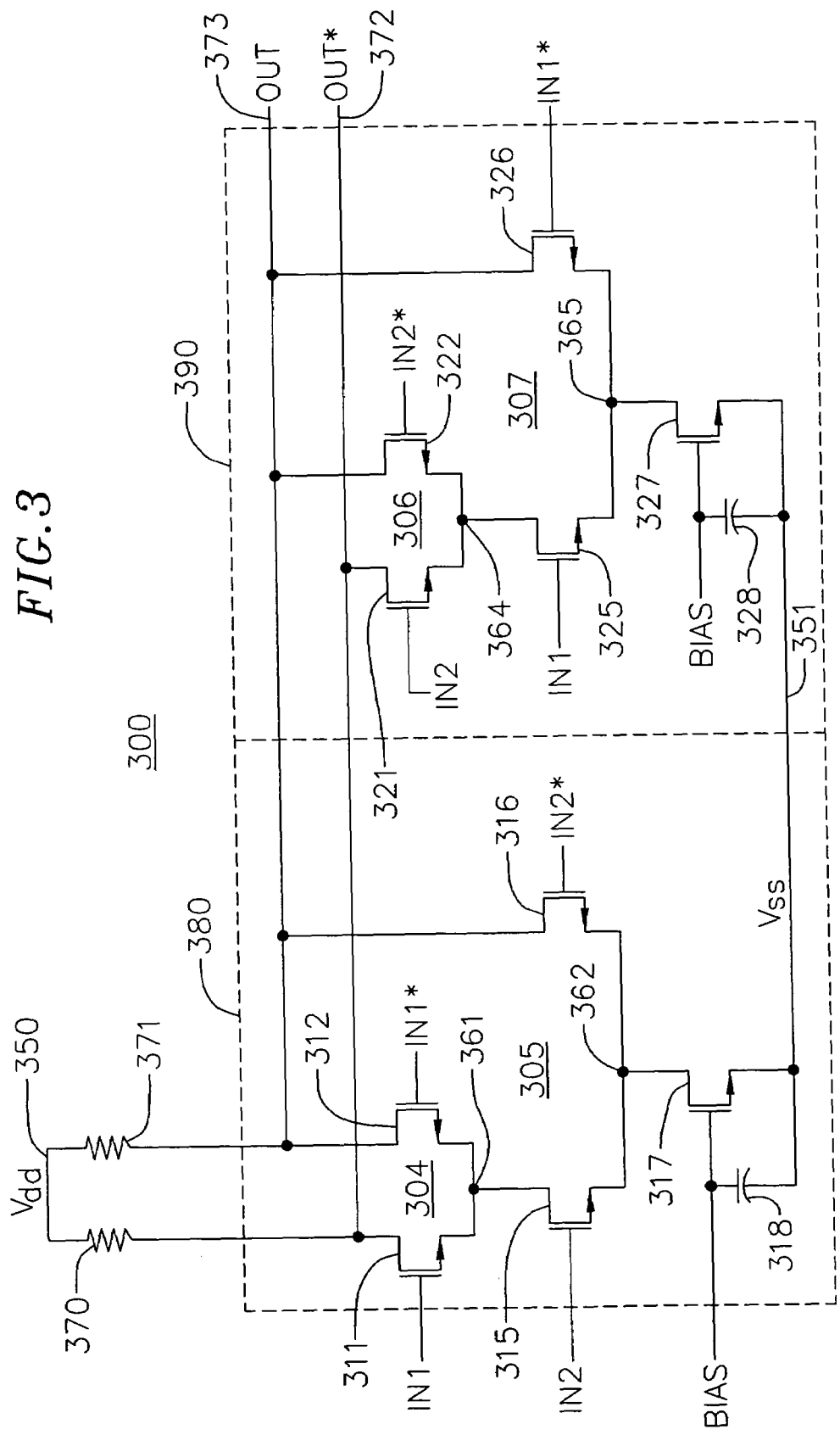
FIG. 3 illustrates an AND logic circuit according to one embodiment of the present invention.

FIG. 3 illustrates an AND logic circuit 300 according to one embodiment of the present invention. AND logic circuit 300 includes two AND logic units 380 and 390. Each logic unit includes two differential input pairs and a current source. The output of each logic unit is coupled to a differential load resistors 370 and 371 for driving one or the other output terminals OUT and OUT* to a high voltage in accordance with the logical operation carried out on the inputs. Because AND logic circuit 300 includes a differential output on output terminals 372 and 373, it is to be understood that a NAND logical operation may be obtained simply by switching the outputs.

The input signals to AND logic circuit 300 are differential inputs {IN1, IN1*} and {IN2, IN2*} and a bias input "BIAS" for generating current in the circuit. AND circuit 300 receives differential input signals in each of the two AND logic units 380 and 390. Each AND logic unit 380 and 390 includes two differential input pairs, 304–305 and 306–307, respectively. Differential input pairs 304 and 305 include NMOS transistors 311, 312, 315, and 316. Transistors 311 and 312 have their source outputs coupled together (i.e., form a source coupled pair) at node 361, and transistors 315 and 316 have their sources coupled together at node 362 to form a source coupled pair. Likewise, differential input pairs 306 and 307 include NMOS transistors 321, 322, 325, and 326. Transistors 321 and 322 have their source outputs coupled together at node 364 to form a source coupled pair, and transistors 325 and 326 have their source outputs coupled together at node 365 to form a source coupled pair. The current in the differential input pairs 304 and 306 is controlled by NMOS transistors 315–316 and 325–326, respectively. Current in each AND logic unit may be generated by a bias current transistor (e.g., NMOS transistors 317 and 327), which receives a bias voltage "BIAS" on a gate input terminal. The gate input terminals of transistors 317 and 327 may also be coupled to capacitors 318 and 328, respectively.

AND circuit 380 receives differential input signals {IN1, IN1*} comprising a logic input signal and the inverse of the logic input signal at the input terminals of differential input transistors 311–312. Differential inputs {IN2, IN2*}, which also comprise a logic input signal and the inverse of the logic input signal, are coupled to the input terminals of transistors 315 and 316. Similarly, AND circuit 390 receives differential input signals {IN2, IN2*} at the input terminals of differential input transistors 321–322. Input signals {IN1, IN1*} are coupled to the input terminals of transistors 325 and 326.

AND circuit 380 receives differential input signals IN1 and IN1* comprising a logic input signal and the inverse of the logic input signal at the input terminals of differential input transistors 311 and 312, respectively. Differential inputs IN2 and IN2*, which also comprise a logic input signal and the inverse of the logic input signal, are coupled to the input terminals of transistors 315 and 316, respectively. Similarly, AND circuit 390 receives differential input signals IN2 and IN2* at the input terminals of differential input transistors 321 and 322, respectively. Input signals IN1 and IN1* are coupled to the input terminals of transistors 325 and 326, respectively.

The current generated by transistors 317 and 327 may be selectively coupled to each output terminal 372 and 373 in response to the differential input signals received at the input of AND circuit 300. The drain output of transistor 317 is coupled to source coupled node 362 of differential pair 305, and the drain output of transistor 315 is coupled to source coupled node 361 of differential pair 304. The drain outputs of transistors 311 and 321 are connected to resistor 370 and output terminal 372. Consequently, when the input signals are in a state that produces a current path between the drain of transistor 317 and output terminal 372, the output will drop in voltage. Similarly, the drain output of transistor 327 is coupled to source coupled node 365 of differential pair 307, and the drain output of transistor 325 is coupled to source coupled node 364 of differential pair 306. The drains of transistors 312, 316, 322, and 326 are connected to resistor 371 and output terminal 373. Consequently, when the input signals are in a state that produces a current path between the drain of transistor 327 and output terminal 373, the output will drop in voltage. Resistors 370 and 371 are also connected to supply terminal 350 ("Vdd"), which pulls the output terminals 372 and 373 (OUT and OUT*) to the supply voltage when the combined input signals do not establish a current path between the drains of transistors 317 or 327 and the output terminals.

Figure 4:
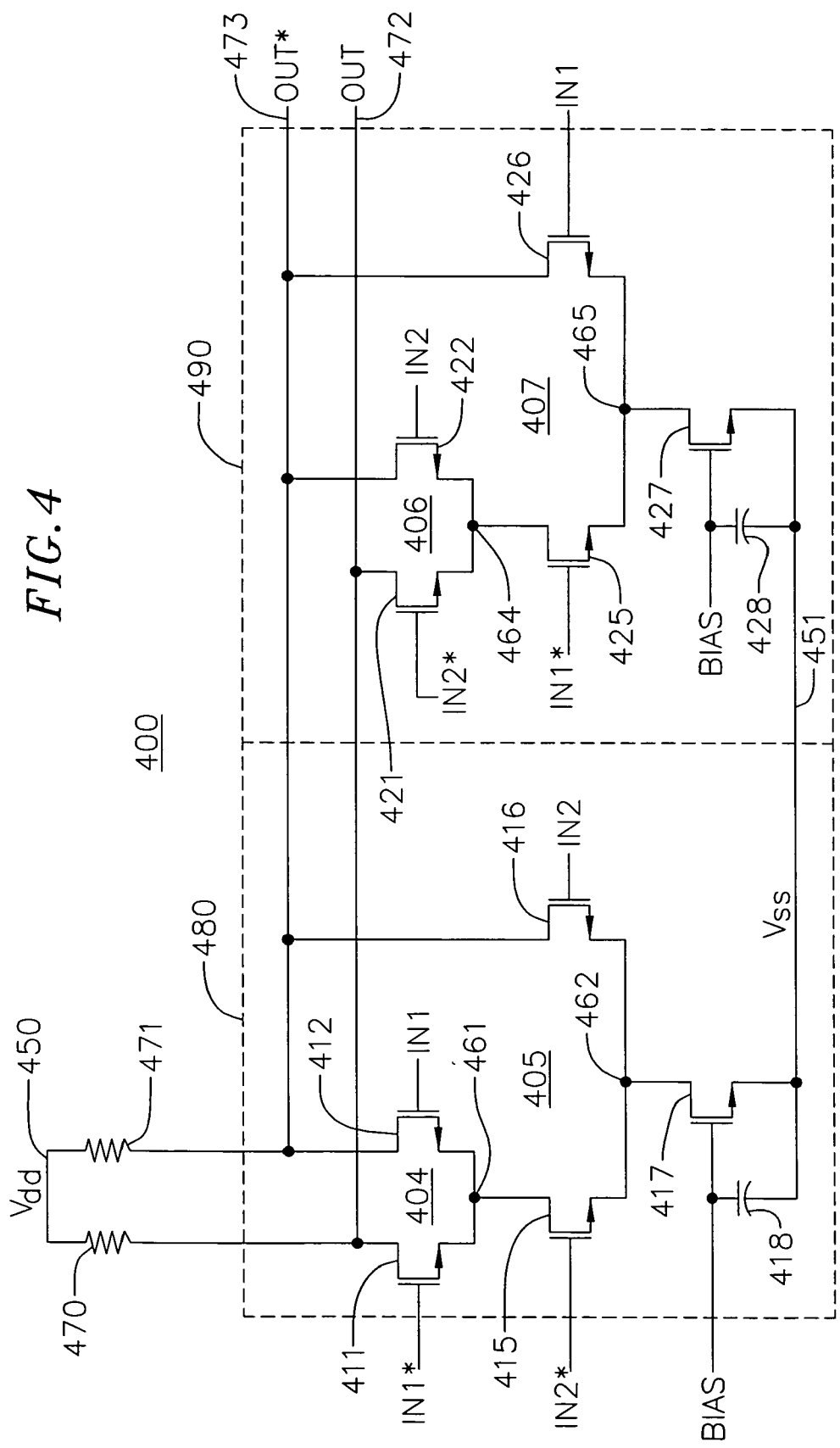
FIG. 4 illustrates an OR logic circuit according to one embodiment of the present invention.

FIG. 4 illustrates an OR logic circuit 400 according to one embodiment of the present invention. OR logic circuit 400 includes two OR logic units 480 and 490. Each logic unit includes two differential input pairs and a current source. The output of each logic unit is coupled to a differential load resistors 470 and 471 for driving one or the other output terminals OUT and OUT* to a high voltage in accordance with the logical operation carried out on the inputs. Because OR logic circuit 400 includes a differential output on output terminals 472 and 473, it is to be understood that a NOR logical operation may be obtained simply by switching the outputs.

The input signals to OR logic circuit 400 are differential inputs {IN1, IN1*} and {IN2, IN2*} and a bias input "BIAS" for generating current in the circuit. OR circuit 400 receives differential input signals in each of the two OR logic units 480 and 490. Each OR logic unit 480 and 490 includes two differential input pairs, 404–405 and 406–407, respectively. Differential input pairs 404 and 405 include NMOS transistors 411, 412, 415, and 416. Transistors 411 and 412 have their source outputs coupled together (i.e., form a source coupled pair) at node 461, and transistors 415 and 416 have their sources coupled together at node 462 to form a source coupled pair. Likewise, differential input pairs 406 and 407 include NMOS transistors 421,422,425, and 426. Transistors 421 and 422 have their source outputs coupled together at node 464 to form a source coupled pair, and transistors 425 and 426 have their source outputs coupled together at node 465 to form a source coupled pair. The currents in the differential input pairs 404 and 406 are controlled by NMOS transistors 415–416 and 425–426, respectively. Current in each OR logic unit may be generated by a bias current transistor (e.g., NMOS transistors 417 and 427), which receives a bias voltage "BIAS" on a gate input terminal. The gate input terminals of transistors 417 and 427 may also be coupled to capacitors 418 and 428, respectively.

OR circuit 480 receives differential input signals IN1 and IN1* comprising a logic input signal and the inverse of the logic input signal at the input terminals of differential input transistors 412 and 411, respectively. Differential inputs IN2 and IN2*, which also comprise a logic input signal and the inverse of the logic input signal, are coupled to the input terminals of transistors 416 and 415, respectively. Similarly, OR circuit 490 receives differential input signals IN2 and IN2* at the input terminals of differential input transistors 422 and 421, respectively. Input signals IN1 and IN1* are coupled to the input terminals of transistors 426 and 425, respectively.

The current generated by transistors 417 and 427 may be selectively coupled to each output terminal 472 and 473 in response to the differential input signals received at the input of OR circuit 400. The drain output of transistor 417 is coupled to source coupled node 462 of differential pair 405, and the drain output of transistor 415 is coupled to source coupled node 461 of differential pair 404. The drain outputs of transistors 411 and 421 are connected to resistor 470 and output terminal 472. Consequently, when the input signals are in a state that produces a current path between the drain of transistor 417 and output terminal 472, the output will drop in voltage. Similarly, the drain output of transistor 427 is coupled to source coupled node 465 of differential pair 407, and the drain output of transistor 425 is coupled to source coupled node 464 of differential pair 406. The drains of transistors 412, 416, 422, and 426 are connected to resistor 471 and output terminal 473. Consequently, when the input signals are in a state that produces a current path between the drain of transistor 427 and output terminal 473, the output will drop in voltage. Resistors 470 and 471 are also connected to supply terminal 450 ("Vdd"), which pulls the output terminals 472 and 473 (OUT and OUT*) to the supply voltage when the combined input signals do not establish a current path between the drains of transistors 417 or 427 and the output terminals.

Having fully described several embodiments of the present invention, other equivalent or alternative methods of practicing the present invention will be apparent to those skilled in the art. For instance, it would be evident to those skilled in the art that other logic circuit configurations would also benefit from utilizing multiple symmetric logic units.

In particular, other current mode logic ("CML") besides $C^3MOS$ could be used. These and other embodiments as well as alternatives and equivalents to the invention will be recognizable to those of skill in the art after reading the description of the present invention. The scope of the invention should not, therefore, be determined solely by reference to the above description, but instead should be determined with reference to the appended claims along with their full scope of equivalents and alternatives.

What is claimed is:

1. A method of providing symmetric differential logic operations comprising:
    receiving, at a first differential logic unit, first and second differential logic signals on first and second pairs of differential inputs, respectively;
    performing, by the first differential logic unit, a logical operation on the first and second logic signals;
    producing, by the first differential logic unit, first differential output signals on a first pair of differential outputs, wherein a first circuit configuration is associated with the first pair of differential inputs and a second circuit configuration, different than the first circuit configuration, is associated with the second pair of differential inputs;
    receiving, at a second differential logic unit, the second differential logic signals on a third pair of differential inputs coupled to the second pair of inputs on the first logic unit;
    receiving, at the second differential logic unit, the first differential logic signals on a fourth pair of differential inputs coupled to the first pair of signals on the first logic unit;
    performing, by the second differential logic unit, the logical operation on the first and second logic signals; and
    producing, by the second differential logic unit, second differential output signals on a second pair of differential outputs coupled to the first pair of differential outputs, wherein the first circuit configuration is associated with the third pair of differential inputs and the second circuit configuration is associated with the fourth pair of differential inputs.

2. The method of claim 1 wherein the first and second circuit configurations are associated with different transition characteristics.

3. The method of claim 2 wherein the transition characteristics comprise rise times.

4. The method of claim 2 wherein the transition characteristics comprise fall times.

5. The method of claim 1 wherein each logic unit generates signals having different characteristics depending on whether a signal is received at the first pair of differential inputs or the second pair of differential inputs.

6. The method of claim 5 wherein the characteristics comprise transition characteristics.

7. The method of claim 6 wherein the transition characteristics comprise rise times.

8. The method of claim 6 wherein the transition characteristics comprise fall times.

9. The method of claim 1 wherein characteristics of the first and second circuit configurations depend on operating frequency.

10. The method of claim 1 wherein the logical operation comprises at least one of XOR, AND, NAND, OR and NOR logic operations.

11. A method of providing symmetric differential logic operations comprising:
    providing a first differential logic unit and a second differential logic unit wherein the first differential logic unit and the second differential logic unit incorporate similar structure to perform the same type of logic operation;
    wherein each of the logic units comprises a first differential logic input and a second differential logic input, wherein the first differential logic input is associated with a first set of characteristics and the second logic input is associated with a second set of characteristics;
    receiving a pair of differential logic signals;
    providing the differential logic signals to opposite logic inputs of the first differential logic unit and the second differential logic unit; and
    coupling differential outputs of the first differential logic unit and the second differential logic unit.

12. The method of claim 11 wherein the set of characteristics comprise transition characteristics.

13. The method of claim 12 wherein the transition characteristics comprise rise times.

14. The method of claim 12 wherein the transition characteristics comprise fall times.

15. The method of claim 11 wherein each logic unit generates signals having different characteristics depending on whether a signal is received at the first differential logic input or the second differential logic input.

16. The method of claim 15 wherein the characteristics of the signals comprise transition characteristics.

17. The method of claim 16 wherein the transition characteristics comprise rise times.

18. The method of claim 17 wherein the transition characteristics comprise fall times.

19. The method of claim 11 wherein the set characteristics of the first and second circuit configurations depend on operating frequency.

20. The method of claim 11 wherein the type of logical operation comprises at least one of XOR, AND, NAND, OR and NOR logic operations.

* * * * *